(12) United States Patent
Muller et al.

(10) Patent No.: US 7,173,416 B2
(45) Date of Patent: Feb. 6, 2007

(54) MEASUREMENT PROBE AND AUTHENTICATION DEVICE COMPRISING THE SAME

(75) Inventors: Edgar Muller, Fribourg (CH); Philipp Egger, Lausanne (CH); Myron Seto, Lausanne (CH)

(73) Assignee: SICPA Holding S.A., Prilly (CH)

( * ) Notice: Subject to any disclaimer, the term of this patent is extended or adjusted under 35 U.S.C. 154(b) by 129 days.

(21) Appl. No.: 10/505,443

(22) PCT Filed: Mar. 4, 2002

(86) PCT No.: PCT/EP02/02283

§ 371 (c)(1),
(2), (4) Date: Sep. 1, 2004

(87) PCT Pub. No.: WO03/075030

PCT Pub. Date: Sep. 12, 2003

(65) Prior Publication Data

US 2005/0225322 A1    Oct. 13, 2005

(51) Int. Cl.
*G01R 33/12* (2006.01)
*G01B 7/00* (2006.01)
*G01N 27/72* (2006.01)

(52) U.S. Cl. .................. 324/228; 324/243

(58) Field of Classification Search ........ 324/239, 324/242–243, 228
See application file for complete search history.

(56) References Cited

U.S. PATENT DOCUMENTS

| | | | |
|---|---|---|---|
| 3,500,134 A | 3/1970 | Marcher | |
| 4,117,523 A | 9/1978 | Masuda et al. | |
| 4,179,685 A | 12/1979 | O'Maley | |
| 4,901,016 A | 2/1990 | Kusatani et al. | |
| 5,278,500 A | 1/1994 | Seitz | |
| 5,287,056 A | 2/1994 | Jackson et al. | |
| 5,432,444 A * | 7/1995 | Yasohama et al. | 324/240 |
| 6,204,667 B1 * | 3/2001 | Won | 324/329 |

FOREIGN PATENT DOCUMENTS

| | | |
|---|---|---|
| DE | 2834287 | 2/1980 |
| DE | 3138887 | 4/1983 |
| EP | 537513 | 4/1993 |
| EP | 586310 | 3/1994 |
| FR | 2547659 | 12/1984 |
| FR | 2686980 | 8/1993 |
| JP | 8199498 | 8/1996 |
| SU | 1007052 | 3/1983 |

* cited by examiner

*Primary Examiner*—Bot LeDynh
(74) *Attorney, Agent, or Firm*—Shoemaker and Mattare

(57) ABSTRACT

The invention refers to a measurement probe for measuring magnetization data of at least one item (7), specifically a security document comprising at least one magnetic security material (M), said measurement probe comprising at least one core free magnetizing coil (3) characterized in that at least two magnetic field sensors (4s, 4c, 8s, 8c) are disposed at both ends inside said coil (3) at its both ends. The invention relates further to an authentication device comprising said measurement probe and to an authentication method carried out by means of said measurement probe and authentication device.

19 Claims, 5 Drawing Sheets

MEASUREMENT PROBE AND AUTHENTICATION DEVICE COMPRISING THE SAME

FIELD OF INVENTION

The invention concerns a measurement probe and an authentication device comprising the same, for the authentication of a security document or article by recording and comparing magnetic characteristics of said document or article, whereby said magnetic characteristics are tied to a magnetic material which is either contained in said document or article, or applied to it by the means of an ink, a coating composition or a foil.

STATE OF THE ART

Magnetic inks are known in the art of security printing. The "US currency black", printed on dollar bills since more than a century, is based on magnetite powder, $Fe_3O_4$, used as a black pigment. Numerous other magnetic materials have been proposed and used as pigments in inks and coating compositions, such as iron, cobalt and nickel powders, brown iron oxide $Fe_2O_3$, chromium dioxide $CrO_2$, ferrites $MFe_2O_3$ (with M=a divalent ion such as $Mg^{2+}$, $Mn^{2+}$, $Co^{2+}$, $Ni^{2+}$, $Zn^{2+}$, etc.), e.g. $ZnFe_2O_3$, garnets $A_3B_5O_{12}$ (with A=a trivalent rare earth ion and $B=Al^{3+}$, $Fe^{3+}$, $Ga^{3+}$, $Bi^{3+}$, etc.), e.g. yttrium-iron-garnet $Y_3Fe_5O_{12}$ (YIG), and the more.

Magnetic materials are noteworthy characterized by the dependence of their magnetization strength B in function of an applied external magnetic field H. At low magnetic field H, the magnetization B is roughly proportional to H, i.e. $B=\mu \cdot H$; the proportionality constant $\mu$ is called the relative magnetic permeability. A non-linear behavior of the magnetization function B(H) is generally observed at high magnetic fields H, where $\mu$ eventually becomes equal to one, i.e. upon magnetic saturation. All magnetic materials show magnetic saturation.

Many magnetic materials show furthermore a non-reciprocal magnetization function, i.e. on decreasing the magnetic field strength H from the saturation value to zero, B remains at some fixed value $B_r$ (magnetic remanence). To bring B back to zero again, a negative magnetic field $-H_c$ (magnetic coercivity) must be applied to the material. This non-reciprocal magnetic behavior is called hysteresis, and the B(H) curve, or magnetization characteristics of such a material is called the hysteresis curve.

FIG. 1a shows the hysteresis curve of a coercive magnetic material, wherein the magnetization strength B is plotted against the magnetizing field strength H. The non-linear nature of the B(H) magnetizing function is put in evidence, as well as $H_c$, the coercivity of the magnetic material, $B_r$, the remanent magnetization after removal of the external field, and $B_s$, the saturation magnetization (where $\mu=1$) of the material. $H_c$ is a material-specific and quantity-independent (intensive) value, whereas $B_r$ and $B_s$ are quantity-dependent (extensive) values.

In practical application, either the magnetization B as a function of H, or the magnetic induction, i.e. the time derivative dB(H)/dt as a function of H(t), can be measured using appropriate sensing devices. FIG. 1b shows the magnetic induction dB/dt, such as obtained with a sensing coil, and corresponding to a travel from point b to point d on the hysteresis curve depicted in FIG. 1a.

For authentication purposes of security documents or articles carrying magnetic inks or coatings it is of interest to exploit the material-related magnetization (e.g. the hysteresis) curve $B(H)=\mu \cdot H$ of the magnetic feature. The measurement of a magnetization or hysteresis curve usually requires heavyweight laboratory equipment. Such equipment, the hysteresismeter, comprises a measurement probe for the production and sensing of magnetic fields, together with the necessary driver and data processing electronics.

The layout of a magnetic measurement probe, such as known in the art and used with laboratory hysteresismeters, is schematically depicted in FIG. 2a. A sample of magnetic material M' is placed inside a first part of a magnetizing coil 3. The coil 3 is a cylinder-shaped, magnetic core free coil, i.e. a solenoid, which is driven by a periodically varying electric current I(t), producing hereby a periodically varying magnetizing field H(t). The magnetic material M' inside the coil is magnetized by the field H(t), producing an additional component $B(t)=A \cdot \mu(H) \cdot H(t)$ to the magnetic field H(t). A is a constant of proportionality, related to the amount of magnetic material present.

A sensing coil 4s is arranged on top of said first part of said magnetizing coil, containing the sample M'. A compensating coil 4c is arranged on top of a second part of the magnetizing coil, containing no sample. The varying magnetic field H(t) induces voltages $U_s$ and $U_c$ in the sensing and compensating coil, respectively:

$$U_s \approx d(H+B)/dt \approx dH/dt(1+A \cdot \mu(H))$$

$$U_c \approx dH/dt$$

The sensing and compensating coils are mechanically arranged in a symmetric way and electrically balanced with respect to each other, and both are connected to common ground (Gnd), such that $U_s - U_c$ is zero in the absence of magnetic material inside the sensing coil. In the presence of magnetic material inside the sensing coil 4s, an asymmetric contribution $A \cdot \mu(H) = dB_M/dt$ arises, which can be detected as the difference of $U_s - U_c$.

To perform said measurement, the magnetic sample material must be placed inside said magnetizing coil, in order to assure homogeneous magnetic field conditions throughout the whole sample volume. Such conditions are noteworthy present in the interior of a cylinder coil, where the magnetic field lines are parallel and of constant density. Outside the coil, the magnetic field lines diverge and the field becomes inhomogeneous. Measurement of magnetization characteristics of bulk materials is thus normally precluded outside the magnetizing coil, because not all parts of the sample under test experience the same field strength. To remedy this shortcoming, certain instruments use a similar pair of large coils having their axes aligned. Such coils known as Helmholtz coils, are able to create a volume of homogeneous magnetic field in free space, but they need the sample to be inserted in between both coil parts.

Due to the mentioned geometric constraints, extended and flat magnetic objects such as magnetic printings or magnetically coated articles are difficult to handle as samples. Either they must be cut into pieces, in order to fit into the available measurement space of the hysteresismeter (destructive method of analysis), or a very particular instrument must be provided, having a coil on top of and a coil underneath the sample to be measured.

Non-destructive M(H) magnetic measurement probes have been disclosed, for example, in U.S. Pat. No. 4,843,316, U.S. Pat. No. 4,901,016, JP 02,248,879, FR-A-2,686980, and DE-A-3 138 887. However, none of these probes is suitable for the "on-top" authentication of extended sheets, such as paper carrying a magnetic printing or coating. The measurement probes of the prior art have in particular been conceived for the characterization of recording media having flat surfaces; said probes cannot be successfully applied to textured surfaces, such as represented by a magnetic Intaglio printing.

It would be desirable to have means available for non-destructively assessing the magnetic characteristics of a sheet-like extended, textured material, such as a paper carrying a magnetic printing or coating. It would furthermore be particularly desirable to have a method and a device available which allow "on-top" authentication of magnetic characteristics on a printed value document or article, i.e. without the requirement of having two aligned magnetization coils on both sides of the document.

SUMMARY OF THE INVENTION

It is an object of the present invention to provide a measurement probe allowing the measurement of magnetic characteristics of a sheet-like material without limitations concerning the extension of said material sheet. Such a measurement probe should noteworthy allows a reliable, easy to implement and high-speed compatible authentication of a sheet-like material, by simply positioning and/or moving a measurement probe on and/or over the surface of said document or article.

This object of the present invention is solved by a magnetic measurement probe and an authenticating device comprising the same, as well as by a method of authentication, carried out using said device according to the features of the claims.

BRIEF DESCRIPTION OF THE DRAWINGS

The invention is explained by means of the drawings:

FIG. 1b shows a magnetic induction curve dB(H)/dt corresponding to a travel from point b to point c of the hysteresis curve of FIG. 1a.

The invention is based on a significant improvement of the magnetic measurement probe, which enables it for the "on-top" acquisition of magnetic characteristics, such as B(H) hysteresis, or dB(H)/dt magnetization characteristics of sheet-like materials. The materials may hereby be textured or flat.

In fact, it was surprisingly found that the magnetization properties of thin sheet-like materials, such as printings or coatings made with inks or coating compositions comprising magnetic security pigments, can be reliably and rapidly acquired outside the bore of the magnetizing coil if a particular, novel coil- or sensor-arrangement is used. A measurement probe according to these findings is shown in two example embodiments according to FIGS. 3a and 3b.

A cylinder-shaped, magnetic core free solenoid coil 3, made of insulated electrically conducting wire, is used as the magnetizing coil to produce a magnetizing field H(t). This magnetizing field is homogeneous inside said magnetizing coil 3 (field region $H_1$) and inhomogeneous outside said magnetizing coil 3 (field region $H_2$). There are also two small field regions $H_3$ of practical field homogeneity outside said magnetizing coil 3, at both extremes near the coil's magnetic poles. Practical field homogeneity shall mean in this context that the magnetic field strength in the $H_3$ region deviates not more than 15%, preferably 10% from the value $H_1$ it has inside said magnetizing coil 3. This is to be taken as a definition of the $H_3$ region.

Figure 1A:
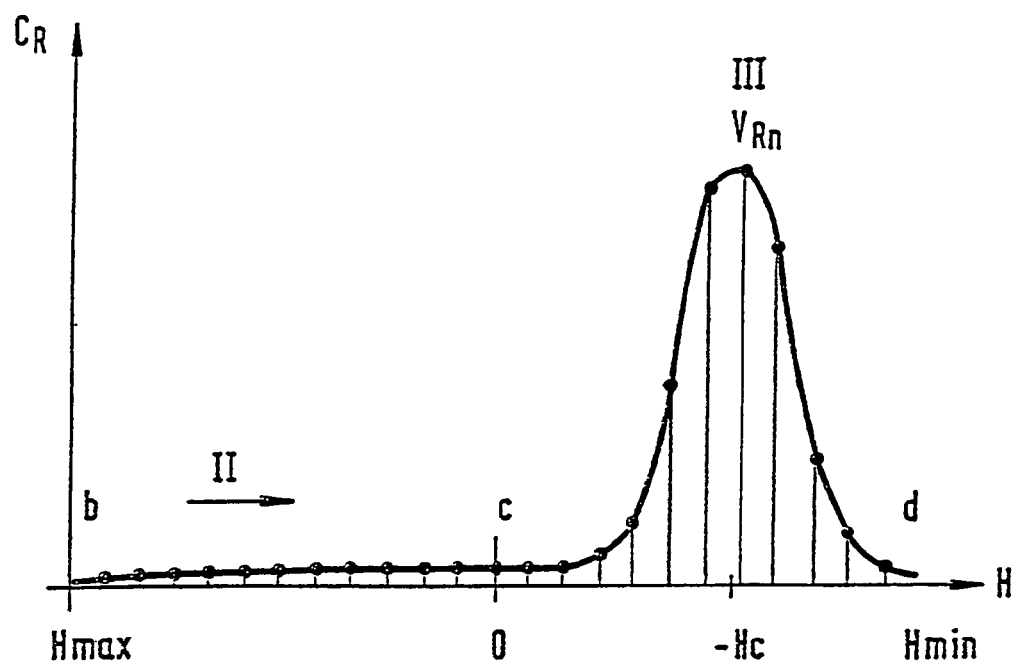
FIG. 1a shows a typical magnetization (hysteresis) curve B(H) of a coercive magnetic material indicating the remanent and saturation magnetization values $B_r$ and $B_s$ as well as the coercive magnetic field $H_c$.
Figure 1B:
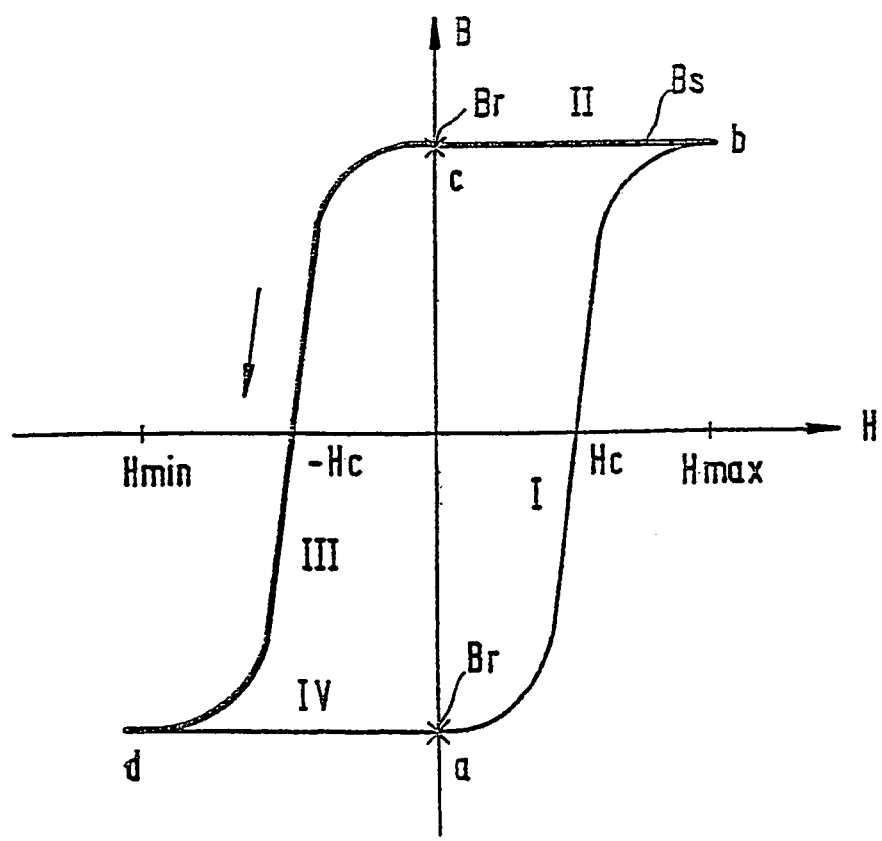
Figure 2A:
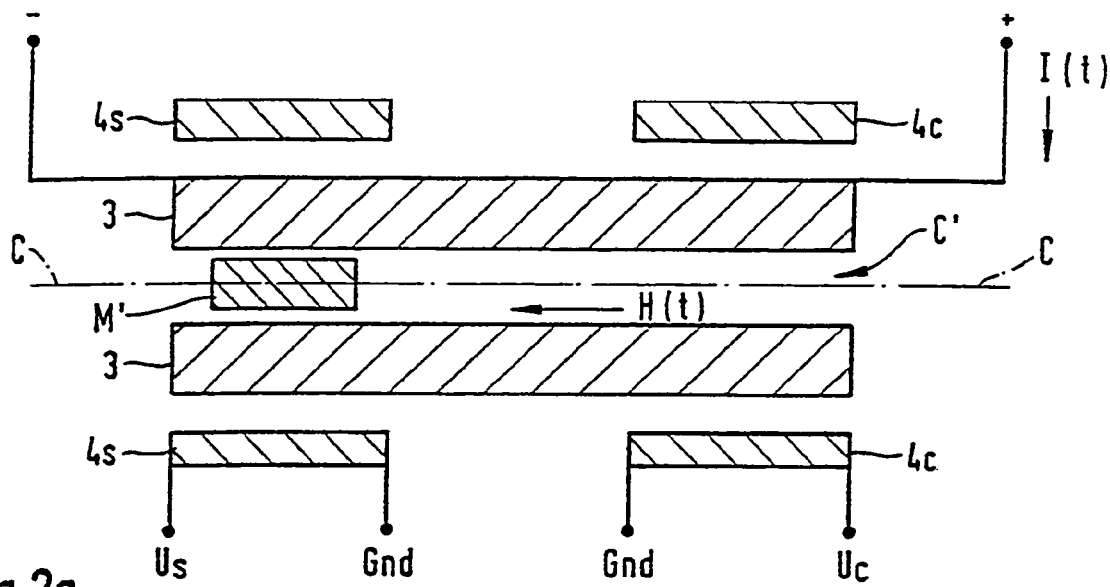
FIG. 2a shows the schematic layout of a standard magnetic measurement probe, as used for the acquisition of magnetization or hysteresis data of a magnetic sample M' placed inside a magnetizing coil.
Figure 2B:
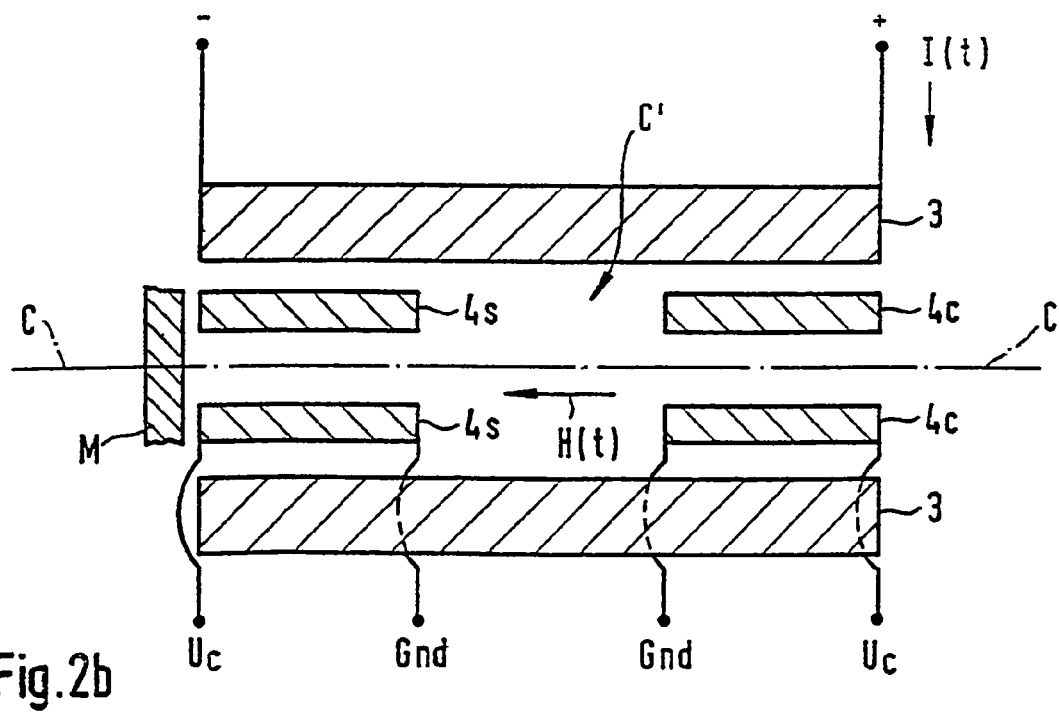
FIG. 2b shows the schematic layout of a novel magnetic measurement probe for the "on-top" acquisition of magnetization or hysteresis data of a sheet-like magnetic sample M placed outside, in front of a magnetizing coil.

The present invention relies on the use of these pole regions $H_3$ for probing the magnetic characteristics of a flat and extended item 7, specifically a security document carrying a magnetic security marking M. According to one aspect of the invention and as schematically shown in a layout according to FIG. 2b, two or more magnetic sensors are disposed inside the magnetizing coil 3 at both of its extremes, preferably near the pole regions $H_3$ of said magnetizing coil 3.

Figure 3A:
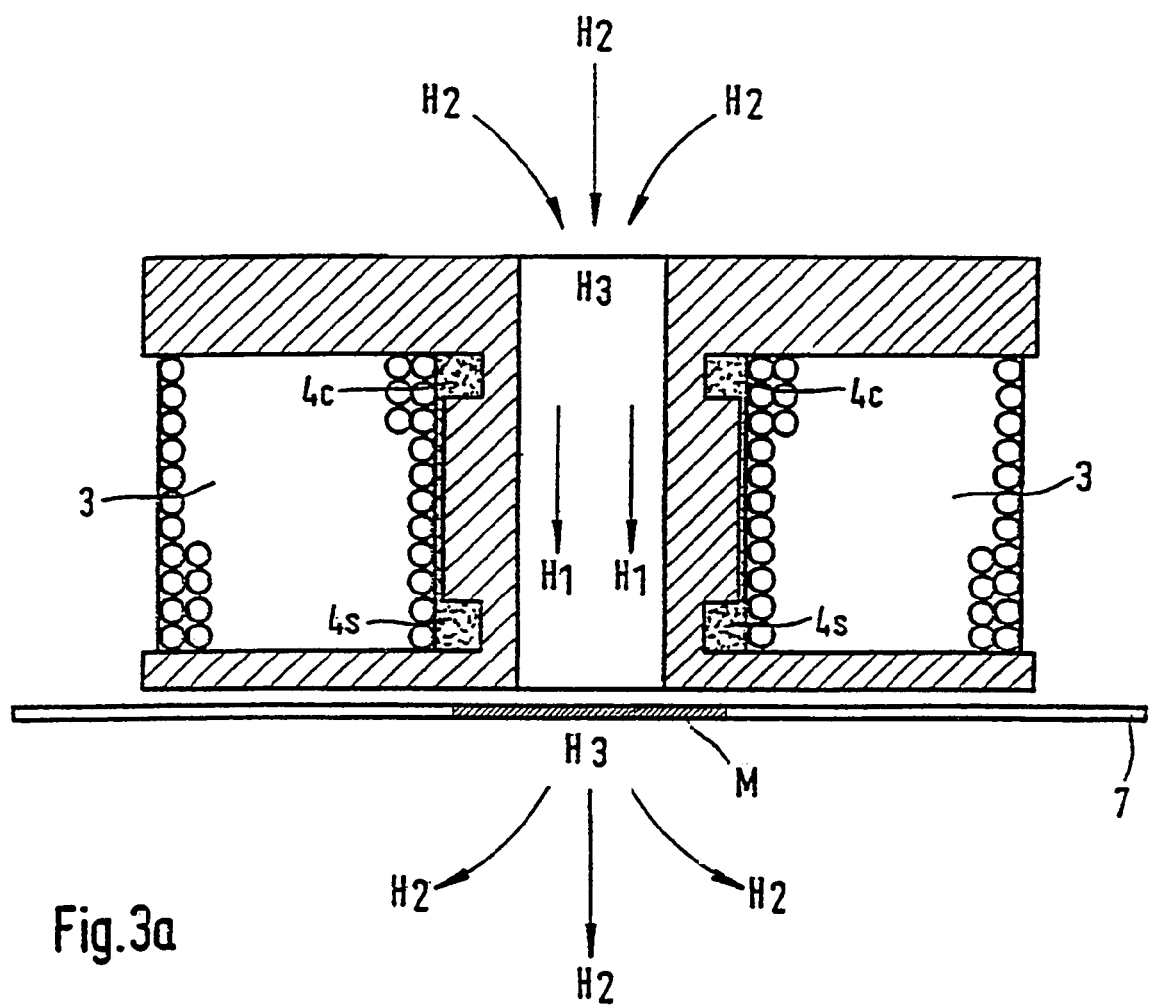
FIG. 3a shows the longitudinal section through a first preferred embodiment of a magnetic measurement probe for measuring magnetic induction data of sheet-like materials 7 with an induction sensing coil 4s and a compensating coil 4c being placed within the cavity of the magnetizing coil 3, at its both ends.

In a first embodiment of a magnetic measurement probe according to FIG. 3a, the magnetic sensors are an induction sensing coil 4s and a compensating coil 4c. They are preferably symmetrically disposed inside the magnetizing coil 3, at its both ends, and have their magnetic coil axes substantially aligned with the coil axis CC of the magnetizing coil 3. The outer diameters of said sensing and said compensating coils 4s and 4c must, according to the present invention, be smaller than the inner diameter of said magnetizing coil 3. Sensing and compensating coils are furthermore preferably kept thin, i.e. their outer diameter is kept close to their inner diameter. The use of induction coils allows to perform a dynamic measurement of the magnetization change dB/dt.

Figure 3B:
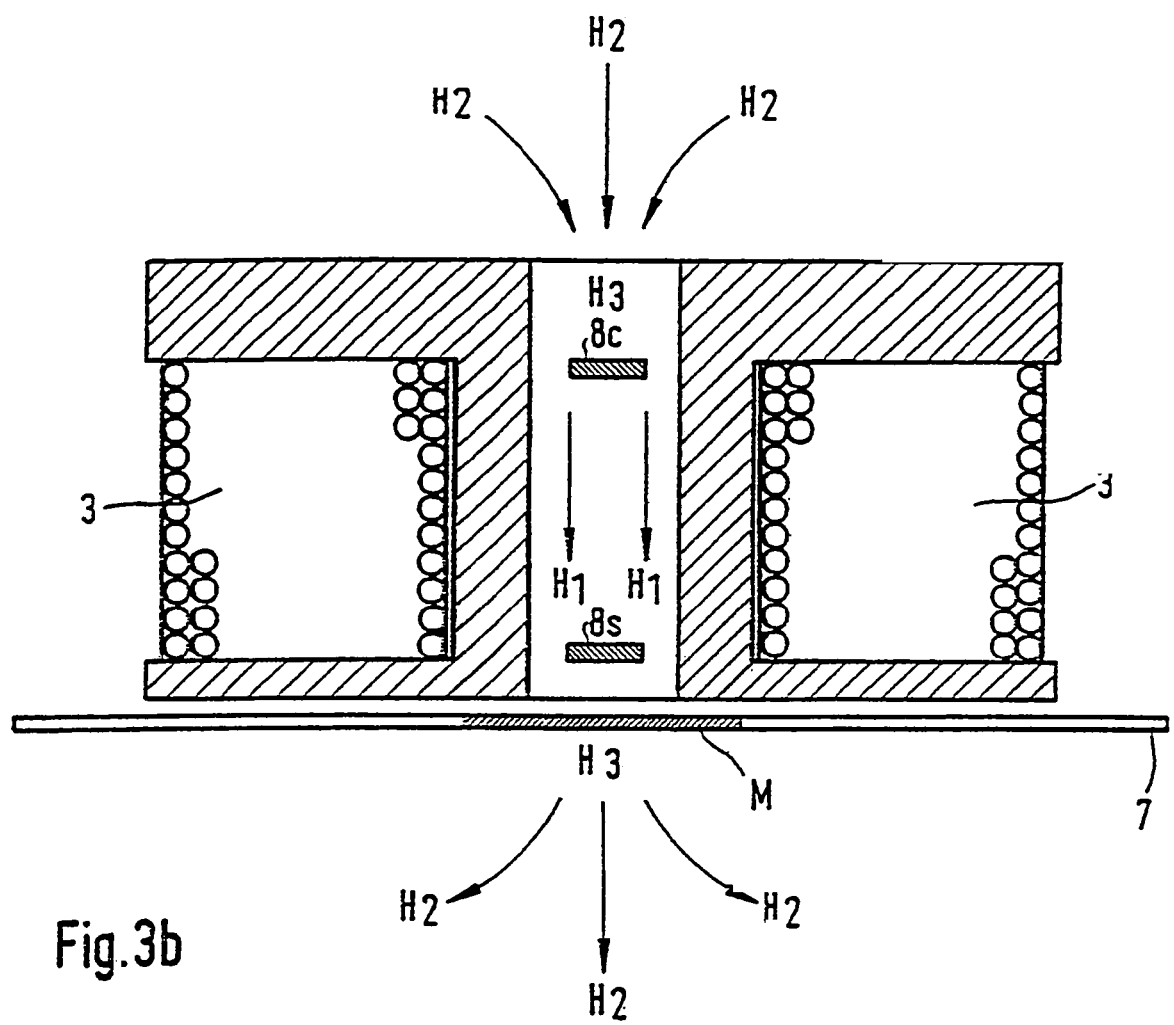
FIG. 3b shows the longitudinal section through a second preferred embodiment of a magnetic measurement probe for measuring magnetization data of sheet-like materials 7 with a field sensing component 8s and a compensating component 8c being placed within the cavity of the magnetizing coil 3, at its both ends.

Alternatively, as shown in a second embodiment of a magnetic measurement probe according to FIG. 3b, the magnetic sensors are a field sensing component 8s and a compensating component 8c, whereby said field sensing component 8s and said compensating component 8c must be smaller than the inner diameter of said magnetizing coil. Said components are preferably symmetrically disposed inside the magnetizing coil 3, at its both ends, and have their magnetic axes substantially aligned with the coil axis CC of the magnetizing coil 3. The field sensing component 8s and the compensating component 8c can be of any type known in the art; in particular, they can be Hall-effect sensors or magnetoresistive (MR, GMR) sensors. Small probes of both types are known in the art and commercially available. The use of magnetic field sensors allows to perform a static measurement of the magnetization B.

For correct operation, the sheet-like item 7 carrying magnetic material M is preferably kept in an appropriate position with respect to the magnetic measurement probe by the means of a probe holder, such that an induction sensing coil or a magnetic field sensor face the magnetic security material M. The field lines of the magnetizing coil 3 should penetrate the sheet-like item 7 substantially orthogonal to its surface. It is not necessary for the induction sensing coil or the magnetic field sensor to directly touch the magnetic security material M. The magnetic security material M may, if necessary, be disposed at a distance of up to half the magnetizing coil's inner diameter away from the magnetic sensor, given that the magnetic field $H_3$ in the relevant measurement zone still fulfills the stated homogeneity condition, i.e. that it does not deviate more than 15%, preferably 10% from its value $H_1$ within the coil 3.

In fact, the key requirement for the correct working of the disclosed measurement probe is that the magnetic material M within the detection area of said magnetic sensor is in a magnetic field region $H_3$ of said magnetizing coil 3 wherein the magnetic field strength does not deviate more than 15%, preferably 10%, from the value $H_1$ it has inside said magnetizing coil 3.

The probe holder may have the additional function of providing a non-magnetic sample support of sufficient thickness, in order to prevent the measurement from magnetic perturbations not originating from the sample's magnetic characteristics, in particular to preclude magnetic perturbations originating from magnetic materials located in the magnetizing coil's far field region. The sample support may be of any non-magnetic material, such as plastic, wood, glass, etc. Strongly electrically conducting supports, such as aluminum or other metals, should be avoided, however, as they can interfere with dynamic magnetic measurements through eddy-current contributions.

Figure 4:
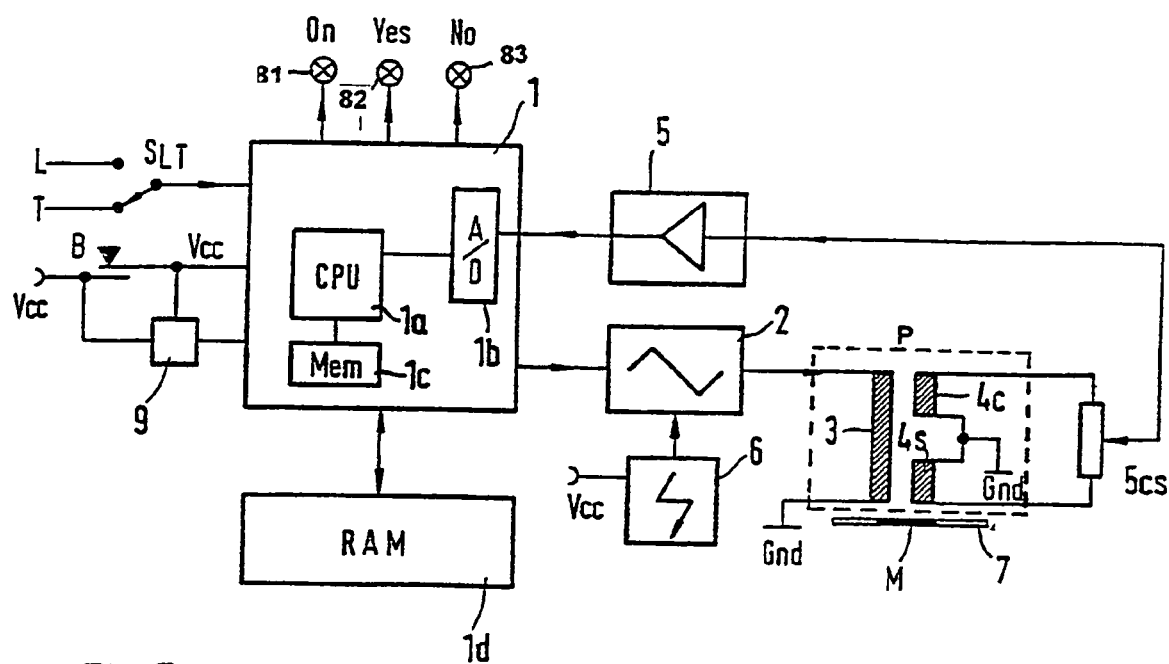
FIG. 4 shows the electric diagram of part of an embodiment of an authentication device using the magnetic measurement probe according to the present invention.
Figure 5:
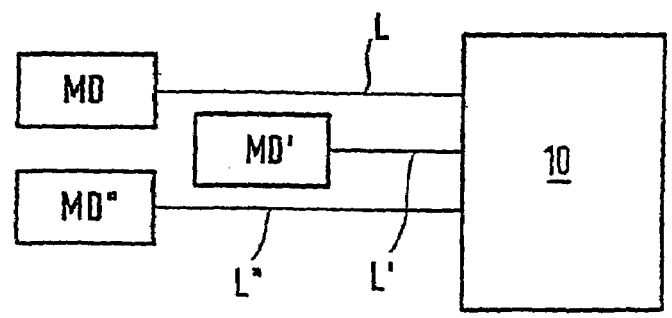
FIG. 5 schematically illustrates part of an embodiment comprising three authenticating devices MD, MD' and MD'' according to the present invention, acquiring magnetic characteristics of items, and uploading the acquired data via communication links 1, 1' and 1'' to a secure server for remote authentication.

An authentication device to be used with the method of the present invention comprises, with reference to FIG. 4, a measurement probe (P) for measuring either magnetization values B or induction values dB/dt, which is coupled to driving (2, 6), sensing (5), and processing electronics (1). Said device comprises further at least one software-implemented algorithm for performing the method according to the invention. The measured magnetization or induction signal value, respectively, is digitized by the processor's A/D converter (1b), and stored in a memory (1c, 1d) as a digital value $V_s$. A plurality of such values $V_s$, acquired for subsequent values of the magnetic field H, finally form a digital point-by-point representation of the sample's induction or magnetization curve, respectively.

In the embodiment of an authentication device according to the present invention, comprising a measurement probe coupled to driving, sensing, and processing electronics, as shown in FIG. 4, the measured electric responses $U_S$, $U_C$ of the sensing and compensating induction or field sensor 4s, 4c; 8s, 8c, respectively, are counter-balanced (subtracted) by means of a balance regulator $5_{CS}$, amplified by an operational amplifier 5, and finally digitized by a processor's A/D converter 1b, for obtaining a digital sample induction or magnetization value $V_S$. By acquiring a plurality of such values $V_s$ for subsequent values of the magnetic field H, a digital point-by-point representation of the sample's induction or magnetization curve, respectively, can be obtained.

The authentication of the item 7 is achieved by acquiring a predetermined plurality of sample induction or magnetization values $V_s$, forming a sample curve portion $C_S$ of the induction or magnetization (e.g. hysteresis) curve of said magnetic security material, and by comparing the values of said sample curve portion $C_S$ with previously stored values of a corresponding reference curve portion $C_R$, using a predefined comparison algorithm and a predetermined tolerance criterion. Said tolerance criterion can hereby either be a single-value criterion, or a conjunction of several conditions which must be fulfilled.

The present invention discloses a method which is based on the use of either a sequence of B(H) magnetization values, such as can be obtained by Hall-effect or Giant Magnetoresistive (GMR) sensors, or of a sequence of corresponding dB(H(t))/dt induction values, such as can be obtained by induction coil sensors, of a magnetic material comprised in, printed on, or applied to a security document or article, as an authenticity-indicating means for said security document or article. Induction values dB(H(t))/dt can noteworthy be obtained and used advantageously for authentication if H(t) is a known function of time. The magnetization or induction function of the material under test is finally represented as a numeric table containing a plurality of (H, B) or (H, dB/dt) value pairs, or simply as a list of B or dB/dt values in the case where H is varying in a known way.

The method of authentication according to the present invention is characterized in that it relies on the use of a same type of device and measurement protocol for acquiring the reference sample magnetization characteristics and the test sample magnetization characteristics, supporting thus a "learning mode" and a "testing mode". Said reference and said test sample characteristics are hereby represented as tables of digital values, which are compared using a predefined comparison algorithm, whereby a decision on authenticity or falsehood is derived from the result of said comparison, using a pre-established authenticity criterion.

The method of authentication according to the present invention works fully model-free and is unaffected by systematic measurement errors which may occur in the authentication device; the hardware of said device can thus be kept considerably simpler than that which would be required for precise absolute measurements. Thus, the method of the present invention relies on a comparison of induction or magnetization "curve forms", represented by sequences of relative values such as they are "seen" by the device of the invention, rather than on a measurement and comparison of individual absolute physical values.

The comparison of said sample magnetization or induction "curve forms" with reference "curve forms" is done on a point-by-point basis, preferably after normalization of said curves. Normalization means that both, sample and reference curve, are linearly scaled, such as to have a same, predefined maximum intensity value. Such normalization renders the comparison concentration-independent; a feature which proves particularly useful in the context of banknote authentication, given the fact that crumpling and use can diminish the amount of magnetic material present on the printing. Comparing normalized magnetization or induction curves corresponds to a mere identification of the magnetic security material as such, independent of the quantity of material which is actually present on the printing. Normalizing proves also useful in view of eliminating the influence of small distance variations between the sample and the measurement probe in the data acquisition (measurement) step.

Said comparison can be performed according to standard mathematical methods as known in the art, such as subtracting corresponding sample and reference values, and using the resulting differences or some quantity derived from them as an indicator for authenticity or falsehood.

The method and device of the invention can be applied to all type of magnetic materials, be they coercive or not. In particular, they can also used to distinguish magnetic materials having zero coercivity (i.e. no hysteresis loop) but different magnetic saturation fields. A large variety of magnetic materials having different coercivity values can thus be distinguished by the method of the invention. It is furthermore possible to prepare mixtures of such magnetic materials to produce even more complex dB/dt curve forms. Any curve form can noteworthy be authenticated by the method and the device of the present invention.

The maximum of the scan field $H_{max}$ can be easily adapted to a specific application, e.g. it can be chosen as low as 100 Gauss for discriminating between different EAS materials, or as high as 1 Tesla for discriminating between different hard-magnetic ferrites.

The authentication device's memory may provide space for storing one or more reference data sets, in order to allow the device to authenticate (and identify) one or more different magnetic materials. Said "learning mode" and said "testing mode" need furthermore not to be implemented on the same physical device; in practice, an authentication device can be provided for exclusively authenticating samples, using reference data sets provided by a separate, "reference definition device". These reference data may be downloaded into the authenticating device's permanent memory, or, alternatively, they may be transferred to the authentication device in the form of a physical memory unit containing them. It is also possible, to keep the reference data in a safe place such as a secure server and to upload at least one measured sample induction or magnetization value for safe and independent comparison on said secure server.

EXEMPLARY EMBODIMENT

According to an embodiment of the measurement probe for the sensing of induction values dB/dt, and with reference to FIG. 3a, the coil body is of fiber-reinforced phenol resin and has an overall length of 10 mm and an overall diameter of 30 mm. The sensing and compensating coils 4s and 4c, are located inside the inner perimeter of the magnetizing coil 3 at its both ends, and have inner diameters and lengths of 7.5 mm and 1.5 mm, respectively. They are each composed of 100 turns of 0.1 mm Ø "enamel" insulated copper wire. The magnetizing coil 3 has an inner diameter of 10 mm and is composed of 200 turns of 0.6 mm Ø "enamel" insulated copper wire. It is disposed on top of the sensing and compensating coils, filling up the remaining space of the coil body. The three coil windings are rigidly embedded in epoxy resin, in order to prevent coil instabilities due to mechanical or electromechanical deformations.

According to an embodiment of the invention, an authentication device comprising said measurement probe P is assembled with reference to FIG. 4. Said authentication device further comprises a processing device 1, embodied by the ADuC812 MicroConverter™ of Analog Devices. The ADuC812 chip comprises a 8052 microprocessor CPU 1a, a 12 bit analog/digital (A/D) converter 1b, as well as internal RAM and electrically erasable permanent EE/Flash memory 1c for program and data storage. The authentication device also comprises 32 K of external random access (RAM) memory 1d.

The authentication device further comprises a voltage up-converter 6 with storage capacitor for producing the necessary coil driver voltage; a coil driver device 2 implemented as a switching bridge and controlled by the microprocessor, for driving the probe's magnetizing coil 3 with a triangular current ramp or with a simplified $\{+U(\Delta t); -U(2\Delta t); +U(\Delta t)\}$ voltage sequence, where $\Delta t$ is a basic time interval; and a sensing coil/compensating coil subtracting operational amplifier 5, whose output is fed into the microcontroller's A/D converter 1b. The input of the operational amplifier 5 is noteworthy connected to a balance regulator $5_{cs}$, allowing the fine-tuning of the compensation ("zero induction") point. The processing electronics 1 is further connected to a mode switch $S_{LT}$ for the selection of learning/testing mode L/T, to a push-button B for initiating the measurement cycle, as well as to yellow, green and red LEDs 81, 82, 83 for indicating the on/off and the approved/failure states. The push-button B is for switching on the circuit's main power supply $V_{cc}$. A processor-controlled power-supply switch 9 is provided, allowing the processor to hold its own power for completing the measurement cycle and to switch itself off in good conditions.

The required maximum current for driving said magnetizing coil 3 is typically of the order of 20 A or more for a coil of 200 turns, producing a magnetic field of the order of 2000 Gauss. The whole measurement cycle lasts of the order of one millisecond or less and is followed by a much longer waiting period, such that no cooling of the coil is required. It was found that the electronic circuitry can be considerably simplified by driving the coil with a rectangular voltage sequence of the form $\{0/+U(\text{during }\Delta t)/-U(\text{during }2\Delta t)/+U(\text{during }\Delta t)/0\}$, provided by a simple switching device. $\Delta t$ is hereby a basic time interval which is chosen appropriately short. Under these circumstances the current in the coil follows an approximately triangular waveform, due to the induction law $d(I(t))=(U/L)dt$.

In an example, the induction curve is sampled, digitized and stored at a rate of 200 kHz. Other, more rapid or slower sampling rates may also be used. The treatment of the raw data may preferably include background (zero) correction and, if necessary, noise filtering. In the case of weak signals, the results of two or more measurement scans may be accumulated and averaged together to improve the signal-to-noise ratio.

According to an embodiment of the invention, a method is implemented in said processing device 1a, for authenticating a security document or article, carrying a thin layer of magnetic material, by the means of the disclosed authentication device and measurement probe. Said method of authentication comprises the steps of:

a) providing, in a digital memory, a digital point-by-point representation of at least part of the magnetization curve B(H) or of the induction curve dB(H(t))/dt of a magnetic reference material, as reference data ($V_R$);

b) providing a security document or article to be authenticated, said security document or article comprising a thin layer of magnetic material in or on at least part of its surface;

c) acquiring into a digital memory, using the authentication device and measurement probe according to the invention, a digital point-by-point representation of at least part of the magnetization curve B(H) or of the induction curve dB(H(t))/dt of said thin layer of magnetic material in or on said document or article provided in step b), as sample data ($V_S$);

d) processing the digital data acquired in step (c) to correct them for measurement-related circumstances;

e) comparing the data obtained in step (d) with the stored reference data provided in step (a), using a predefined comparison algorithm and a predefined tolerance criterion, hereby deriving an authenticity "yes/no" indicator.

According to the invention, the same type of hardware can be used for the definition of said reference data ($V_R$) and said sample data ($V_S$): In a "learning mode", data from a reference sample is acquired and stored as said reference data. In a "testing mode", data from a document or article to be authenticated is acquired, processed, and compared with said reference data, to derive an authenticity/falsehood indicator.

In a preferred example, using said learning and testing mode of the device, a large number of different magnetic sample prints could be distinguished from each other. A set of four standard magnetic pigments M1 to M4, having coercivities ranging from zero to 700 Oersted, were mixed in different ratios into printing inks, to obtain a magnetic security system:

| Pigment | Coercivity [Oe] |
|---|---|
| M1: | ~1 (soft magnetic iron) |
| M2: | ~100 |
| M3: | ~300 |
| M4: | ~700 |

15 Intaglio ink samples S1 to S15 were prepared, containing the magnetic pigments M1 to M4 in different ratios, and using a total pigment weight in the ink of the order of 40 to 50 percent. The pigments were mixed into an intaglio varnish of the type known to the skilled in the art:

|    | M1:M2 | M1:M3 | M1:M4 | M2:M3 | M2:M4 | total [wt %] |
|---|---|---|---|---|---|---|
| S1  | 1.00 |      |      |      |      | 40.00 |
| S2  |      | 1.03 |      |      |      | 47.20 |
| S3  |      |      | 1.00 |      |      | 40.00 |
| S4  | 4.00 |      |      |      |      | 40.00 |
| S5  |      | 4.13 |      |      |      | 42.57 |
| S6  |      |      | 4.00 |      |      | 40.00 |
| S7  | 0.25 |      |      |      |      | 40.00 |
| S8  |      | 0.26 |      |      |      | 53.09 |
| S9  |      |      | 0.25 |      |      | 40.00 |
| S10 |      |      |      | 1.03 |      | 47.20 |
| S11 |      |      |      | 0.26 |      | 53.09 |
| S12 |      |      |      | 4.13 |      | 42.57 |
| S13 |      |      |      |      | 1.00 | 40.00 |
| S14 |      |      |      |      | 0.25 | 40.00 |
| S15 |      |      |      |      | 4.00 | 40.00 |

The resulting inks were printed onto currency-type paper, using a standard intaglio press and an engraved plate of 100 μm gravure depth, to result in magnetic intaglio prints having different magnetic characteristics. The Intaglio prints realized with said ink samples S1 to S15 could all be distinguished from each other by the method and the device disclosed in the present invention.

The invention claimed is:

1. Magnetic measurement probe for the acquisition of magnetization data of a magnetic item, said measurement probe comprising at least one magnetizing coil, wherein at least two magnetic sensors are disposed inside said magnetizing coil, one at each end thereof, said sensors having their magnetic axes substantially aligned with the magnetic field inside the coil, and further comprising a probe holder for keeping item in an appropriate position and distance with respect to said magnetizing coil and said sensors, such that the magnetic material M within the detection area of said magnetic sensors is in a magnetic field region of said magnetizing coil where the magnetic field strength does not deviate more than 15% from its value inside said magnetizing coil.

2. Magnetic measurement probe according to claim 1, wherein said magnetizing coil is a magnetic core free coil.

3. Magnetic measurement probe according to claim 2, wherein said magnetizing coil is a cylinder coil.

4. Magnetic measurement probe according to claim 1, wherein said magnetizing coil is a cylinder coil.

5. Magnetic measurement probe according to claim 1, wherein said magnetic sensors are induction sensors in the form of a sensing coil and a compensating coil, respectively, and the outer diameters of said sensing coil and compensating coil are smaller than the inner diameter of said magnetizing coil.

6. Magnetic measurement probe according to claim 1, wherein said magnetic sensors are magnetic field sensors in the form of a sensing component and a compensating component, respectively, and the outer diameters of said sensing component and compensating component are smaller than the inner diameter of said magnetizing coil.

7. Magnetic measurement probe according to claim 1, wherein said magnetic field strength does not deviate more than 10% from its value inside said magnetizing coil.

8. Magnetic measurement probe according to claim 1, further comprising a sample support made of non-magnetic material of low electric conductivity.

9. Method for measuring magnetization characteristics of at least part of an item, said item comprising at least one magnetic security material, said method comprising the steps of:
   a) positioning a measurement probe according to claim 1 on said item, such that said material is within said magnetic field region of said magnetizing coil where the magnetic field strength does not deviate more than 15% from its value inside said magnetizing coil,
   b) applying by means of said magnetizing coil at least one value of a magnetic field to the item, and
   c) measuring at least one value of magnetic characteristic of said material, using said magnetic sensors.

10. Method according to claim 9, wherein said item is a security document or article.

11. Method according to claim 9, wherein the corresponding magnetization value B of said material is measured upon applying at least one value of magnetic field H to said material.

12. Method according to claim 9, wherein the corresponding induction value dB/dt of said material is measured upon application of a magnetic field variation dH/dt for at least one value of magnetic field H to said material.

13. Method according to claim 9, wherein said item is placed on a probe holder.

14. Authentication device for authenticating at least one item, said item comprising at least one magnetic security material, said authentication device comprising:
   a) a magnetic measurement probe for acquiring magnetization data of a magnetic item, said measurement probe comprising at least one magnetizing coil, wherein at least two magnetic sensors are disposed inside said magnetizing coil, one at each end thereof, said sensors having their magnetic axes substantially aligned with the magnetic field inside the coil, and further comprising a probe holder for keeping item in an appropriate position and distance with respect to said magnetizing coil and said sensors, such that the magnetic material M within the detection area of said magnetic sensors is in a magnetic field region of said magnetizing coil where the magnetic field strength does not deviate more than 15% from its value inside said magnetizing coil, together with corresponding driving and sampling electronics, b) a processing device with implemented algorithm for driving said probe and sampling, digitizing, processing and comparing magnetic characteristic values, c) at least one memory device for storing sample and reference magnetic characteristic values.

15. Authentication device according to claim 14, wherein said item is a security marking.

16. Authentication device according to claim 14, further supporting a learning mode for acquiring and storing reference magnetic characteristics of a magnetic reference item, and a testing mode for acquiring, storing and comparing sample magnetic characteristics from a sample item, to derive an authenticity signal.

17. Authentication device according to claim 14, further comprising data transfer means for performing said comparison of the measured magnetization data of the sample with corresponding previously stored reference values and deriving an authenticity yes/no indicator at a remote place and for transmitting back said authenticity indicator an authentication site.

18. Method for authenticating a security document or article, carrying a thin layer of magnetic material, by means of an authentication device according to claim 14, said method comprising the steps of a) providing, in a digital memory, magnetic characteristic values of a magnetic reference item, as reference data;

b) providing a security document or article to be authenticated, said security document or article comprising a thin layer of magnetic material in or on at least part of its surface;

c) acquiring into a digital memory, using said authentication device, magnetic characteristic values of said document or article provided in step (b);

d) processing the digital data acquired in step (c) to correct them for measurement-related circumstances;

e) comparing the data obtained in step (d) with the corresponding stored reference data provided in step (a), using a predefined comparison algorithm and a predefined tolerance criterion, thereby deriving an authenticity yes/no indicator.

19. Method according to claim 18, wherein said reference data are acquired by said authentication device.

* * * * *